United States Patent
Zhao et al.

(10) Patent No.: US 9,224,597 B2
(45) Date of Patent: Dec. 29, 2015

(54) METHOD FOR MANUFACTURING GALLIUM NITRIDE-BASED FILM CHIP

(71) Applicants: Lattice Power (JIANGXI) Corporation, Nanchang (CN); Shineon (Beijing) Technology Co., Ltd, Beijing (CN)

(72) Inventors: Hanmin Zhao, Nanchang (CN); Hao Zhu, Nanchang (CN); Chuanbing Xiong, Nanchang (CN); Xiaodong Qu, Nanchang (CN)

(73) Assignees: Lattice Power (JIANGXI) Corporation, Nanchang (CN); Shineon (Beijing) Technology Co., Ltd., Beijing (CN)

( * ) Notice: Subject to any disclaimer, the term of this patent is extended or adjusted under 35 U.S.C. 154(b) by 14 days.

(21) Appl. No.: 14/083,487

(22) Filed: Nov. 19, 2013

(65) Prior Publication Data

US 2014/0147987 A1 May 29, 2014

Related U.S. Application Data

(63) Continuation of application No. PCT/CN2012/000664, filed on May 15, 2012.

(30) Foreign Application Priority Data

| May 19, 2011 | (CN) | 2011 1 0132402 |
| May 19, 2011 | (CN) | 2011 1 0132423 |
| May 19, 2011 | (CN) | 2011 1 0132454 |

(51) Int. Cl.
*H01L 21/02* (2006.01)
*H01L 33/00* (2010.01)
*H01L 21/762* (2006.01)
*H01L 33/40* (2010.01)

(52) U.S. Cl.
CPC ........ *H01L 21/0254* (2013.01); *H01L 21/0242* (2013.01); *H01L 21/02664* (2013.01); *H01L 21/76256* (2013.01); *H01L 33/0079* (2013.01); *H01L 33/0095* (2013.01); *H01L 33/405* (2013.01)

(58) Field of Classification Search
None
See application file for complete search history.

(56) References Cited

U.S. PATENT DOCUMENTS

| 2008/0035948 A1* | 2/2008 | Shin et al. ........................ 257/99 |
| 2011/0008632 A1* | 1/2011 | Zheng et al. .................. 428/457 |
| 2011/0127567 A1* | 6/2011 | Seong ............................. 257/99 |
| 2011/0175112 A1* | 7/2011 | David et al. ..................... 257/79 |

* cited by examiner

*Primary Examiner* — Charles Garber
*Assistant Examiner* — Brigitte Paterson
(74) *Attorney, Agent, or Firm* — Hemisphere Law, PLLC (57) ABSTRACT

A method for manufacturing gallium nitride-based film chip is provided. The method comprises: growing a gallium nitride-based semiconductor multilayer structure on a sapphire substrate; thinning and polishing the sapphire substrate; coating a reflecting compound metal layer on the gallium nitride-based semiconductor multilayer structure by evaporating; coating a first glue on the reflecting compound metal layer and solidifying the first glue with a first temporary substrate; peeling the sapphire substrate off by laser; coating a second glue on the peeling surface and solidifying the second glue with a second temporary substrate; removing the first temporary substrate and the first glue; bonding the reflecting compound metal layer with a permanent substrate by eutectic bonding; removing the second temporary substrate and the second glue.

3 Claims, 9 Drawing Sheets

METHOD FOR MANUFACTURING GALLIUM NITRIDE-BASED FILM CHIP

CROSS-REFERENCE TO RELATED APPLICATIONS

This is a continuation of International Application PCT/CN2012000664, with an international filing date of May 15, 2012, which has a priority date of May 19, 2011, claiming benefits of China applications 201110132402.3, 201110132423.5, and 201110132454.0.

BACKGROUND OF THE INVENTION

1. Field of the Invention

The present invention relates to processes for fabricating a semiconductor light-emitting device. More specifically the present invention relates to a method of fabricating GaN-based thin-film chips using laser ablation.

2. Description of Related Art

The sapphire substrate is the main substrate of growing GaN-based LED, but its electrical conductivity and heat dissipation are relatively poor. The poor electrical conductivity forces traditional LED to adopt lateral structure, which causes the current congestion, and poor heat dissipation limits the power of light-emitting device. Using laser tilt-off technique to remove the sapphire substrate to make a vertical structure LED can solve the problem of heat dissipation effectively, but the yield is usually very low. In addition, the stress is from the difference in thermal expansion coefficient of sapphire, GaN films and the support substrate, so the GaN films are easily broken when sapphire substrate is removed. Generally, finding as corresponding bonding method and a support substrate which has a matching thermal expansion and good electrical conductivity and thermal conductivity can solve the problem. But since the bonding interface is not smooth and the gap is small, there will be a pulling force to GaN films during the laser lift-off process and the damage and rupture of GaN films may occur. A traditional method is used by bonding the epitaxial layer on the sapphire with the electrically and thermally conductive substrate directly and then removing the sapphire substrate, but the yield of the chips is very low. And the method cannot solve the stress in the process of laser and leads to cracking of a large number of chips.

BRIEF SUMMARY OF THE INVENTION

First, the present invention provides a method of manufacturing gallium nitride-based film chip to solve the problems of the epitaxial film broken when the sapphire substrate is removed by the laser lift-off technique.

In the present invention, a method of manufacturing gallium nitride-based film chip is provided. The method includes; growing an n-type GaN layer, an active layer and a p-type GaN layer in turn on the sapphire substrate to form semiconductor multilayer structure; thinning and polishing the sapphire substrate; coating a first glue on the semiconductor multilayer structure and solidifying the first glue with a first temporary substrate; removing the sapphire substrate off by laser; coating a second glue on the newly exposed GaN surface and solidifying the second glue with a second temporary substrate; removing the first temporary substrate and the first glue; bonding the semiconductor multilayer structure with a permanent substrate by eutectic bonding, removing the second temporary substrate and the second glue.

In an embodiment of the present invention, coating a conductive and reflective compound metal layer on the semiconductor multilayer structure by evaporating, then alloying the metal multilayer structure, and the alloying temperature is between 400° C. and 600° C.

In an embodiment of the present invention, the thickness of the sapphire substrate is between 100 microns and 150 microns alter thinning and polishing.

In an embodiment of the present invention, the semiconductor multilayer structure is periodically cut to obtain single components.

In an embodiment of the present invention, the first glue is a modified epoxy resin adhesive, its shore hardness is between 80 D and 100 D, resistance temperature is between −25° C. and 300° C., bending strength is between 80 MPa and 120 MPa, compressive strength is between 200 MPa and 300 MPa after curing.

In an embodiment of the present invention, the thickness of the first adhesive is between 10 microns and 100 microns, curing temperature is between 80° C. and 160° C., curing time is between 30 minutes and 120 minutes.

In an embodiment of the present invention, the second glue is a heterocyclic resin modified glue, its resistance temperature is between −55° C. and +420° C., tensile strength is between 60 MPa and 100 MPa, bending strength is between 105 MPa and 200 MPa.

In an embodiment of the present invention, the second adhesive thickness is between 5 microns and 30 microns, curing temperature is between 120V and 180° C., curing time is between 10 minutes and 60 minutes.

In an embodiment of the present invention, the first and second temporary substrate comprises any one of the following materials: silicon, sapphire, glass, and ceramic.

In an embodiment of the present invention, the permanent substrate is a silicon substrate.

In an embodiment of the present invention, the method of the eutectic bonding is Au—Sn bonding and the bonding temperature is between 200° C. and 400° C., The beneficial effects of the first aspect are as following:

The present invention uses glues to transfer the epitaxial layer. Especially, bonding the epitaxial layer with the first temporary substrate using glue before laser lift-off, because the glue has appropriate strength and hardness, it can effectively reduce the tear strength of GaN films when removing the sapphire substrate by laser. So it can reduce the damage of gallium nitride thin films, and greatly improve the yield of the GaN-based thin film chip.

Second, the present invention provides a method for manufacturing chip to solve the problems of the epitaxial film cracking when the sapphire substrate is removed by laser lift-off technique.

According to the aspect of the present invention, a method of manufacturing chip is provided. The method includes:

growing an n-type GaN layer, an active layer and a p-type GaN layer on the sapphire substrate to form epitaxial layer, etching the epitaxial layer, coating a glue on the epitaxial layer and solidifying the glue with a first temporary substrate, removing the sapphire substrate by laser, bonding the newly exposed GaN surface with a second temporary substrate, removing the first temporary substrate and adhesive layer to expose the epitaxial layer, bonding the epitaxial layer with a permanent substrate, corroding the second temporary substrate.

In an embodiment of the present invention, epitaxial wafer is thinned, to between 200 microns and 400 microns before etching.

In an embodiment of the present invention, the depth of etching is at least 1 micron.

In an embodiment of the present invention, evaporating a protective layer on the p-type GaN layer before coating the glue, the protective layer is fabricated by at least one of the following, materials: Ti, Ni, Al, Pt, Pd. Au, Cr, Ag, $SiO_2$, $TiO_2$, ITO, $Al_2O_3$; and $MgF_2$, the thickness is between 100 nanometers and 100 nanometers.

In an embodiment of the present invention, the method of laser lift-off is progressive scan or single die stripping, preferably single die stripping.

In an embodiment of the present invention, evaporating a protective layer on the n-type GaN layer before bonding it with the second temporary substrate, the protective layer is fabricated by at least one of the following materials: Ti, Ni, Al, Pt, Pd, Au, Cr, Ag, $SiO_2$, $TiO_2$, ITO, $Al_2O_3$ and $MgF_2$, the thickness is between 1 nanometer and 100 nanometers.

In an embodiment of the present invention, the method of bonding with the second temporary substrate is at least one of: Au—Au, Au—In, In—In, Ag—In, Ag—Sn and In—Sn, preferably Au—In bonding.

In an embodiment of the present invention, the first temporary substrate, the second temporary substrate and the permanent substrate are fabricated by at least one of the following materials: Si, ceramics, W, Cu, Mo, GaAs and graphite, the first temporary substrate and the second temporary substrate are removed by wet etching or mechanical polishing.

In an embodiment of the present invention, the temporary substrate is silicon substrate. The silicon substrate is removed by wet etching. The etching liquid is composed of at least one of the following materials: sulfuric acid, hydrochloric acid, nitric acid, hydrofluoric acid, acetic acid, potassium hydroxide, hydrogen peroxide, ammonia, bromine, oxalic acid, potassium permanganate, potassium iodide, iodine.

In an embodiment of the present invention, the reflective material is fabricated by at least one of the following material: Ti, Ni, Al, Pt, Pd, Au, Cr, Ag, $SiO_2$, $TiO_2$, ITO, $Al_2O_3$ and $MgF_2$, preferably Ag, Al and $SiO_2$, the thickness is between 50 nanometers and 400 nanometers.

In an embodiment of the present invention, a protective layer is fabricated on the reflective material, which is fabricated by at least one of the following materials: Ti, Ni, Al, Pt, Pd, Au, Cr, Ag, $SiO_2$, $TiO_2$, ITO, $Al_2O_3$ and $MgF_2$, preferably Ti, Ni, Al, Cr, Pt and Au, the thickness of the protective layer is between 1 nanometer and 1000 nanometers.

In an embodiment of the present invention, the method of bonding with the permanent temporary substrate is at least one of: Au—Au, Au—In, In—In, Ag—In, Ag—Sn and In—Sn, preferably Au—Sn bonding.

The beneficial effects of the second aspect are as following:

The present invention uses glue to remove the epitaxial layer, bonding the second temporary in the second transfer process, so the first temporary substrate and glue can be etched smoothly, it improves the production yield.

Another aspect of the present invention provides a method of manufacturing gallium nitride-based film chip on the sapphire to solve the problems of the epitaxial film breaking when the sapphire substrate is removed by laser lift-off technique.

According to the aspect of the present invention, there is a method of manufacturing gallium nitride-based film chip, the method includes: etching the epitaxial layer on the sapphire substrate, evaporating a reflective layer on the epitaxial layer and alloying, bonding the reflective layer with a permanent substrate, coating a resin on the other side of the permanent substrate and solidifying the resin with a second substrate, removing the sapphire substrate by laser, removing the second temporary substrate and the resin.

In an embodiment of the present invention, the method of etching is ICP or RIE, the depth of etching is not less than 1 micron, preferably between 5 microns and 7 microns.

In an embodiment of the present invention, the reflective layer is evaporated by at least one of the following materials: Ti, Ni, Al, Pt, Pd, Au, Cr, Ag, $SiO_2$, $TiO_2$, ITO, $Al_2O_3$ and $MgF_2$, preferably Ag, Al and $SiO_2$, the thickness is between 500 angstroms and 4000 angstroms.

In an embodiment of the present invention, a protective layer is fabricated on the reflective layer, the protective layer is fabricated by at least one of the following materials: Ti, Ni, Al, Pt, Pd, Au, Cr, Ag, $SiO_2$, $TiO_2$, ITO, $Al_2O_3$ and $MgF_2$, preferably Ti, Ni, Al, Cr, Pt and Au, the thickness of the protective layer is between 1000 angstroms and 10000 angstroms.

In an embodiment of the present invention, the method of bonding with the permanent substrate is at least one of: Au—Au, Au—In, In—In, An—In, Ag—Sn and In—Sn. preferably Au—Sn bonding.

In an embodiment of the present invention, the resin is an epoxy-based resin or an acrylic resin, the way of curing is thermal curing or UV curing, and the shore hardness is between 10 D and 95 D, preferably between 50 D and 90 D.

In an embodiment of the present invention, a method of the progressive scan is used to removing Sapphire substrate, the laser wavelength is 355 nm.

In an embodiment of the present invention, the laser lift-off is single grain stripping; the laser wavelength is 248 nm or 192 nm.

In an embodiment of the present invention, the temporary substrate and the permanent substrate are fabricated by at least one of the following materials: Si, ceramics, W, Cu, Mo, GaAs, and graphite, glass, Sapphire, organic materials, the temporary substrate is removed by wet etching or mechanical polishing or layer-stripping.

In an embodiment of the present invention, the temporary substrate is silicon substrate, the silicon substrate is removed by wet etching, and the etching liquid is fabricated by at least one of the following materials: sulfuric acid, hydrochloric acid, nitric acid, hydrofluoric acid, acetic acid, potassium hydroxide, hydrogen peroxide, ammonia, bromine, oxalic acid, potassium permanganate and potassium iodide.

The beneficial effects of the third aspect as following:

In the present invention, epitaxial layer is bonded with the permanent substrate, then adhesive is used to bond the permanent substrate with a temporary substrate, since the adhesive has a certain hardness and strength, it can reduce the tearing force of the GaN film, and increase the device yield.

BRIEF DESCRIPTION OF THE SEVERAL VIEWS OF THE DRAWING(S)

The foregoing and other exemplary purposes, aspects and advantages of the present invention will be better understood in principle form the following detailed description of one or more exemplary embodiments of the invention with reference to the drawings, in which.

DETAILED DESCRIPTION OF THE INVENTION

The invention will now be described in detail through several embodiments with reference to the accompanying drawings.

Figure 1A:
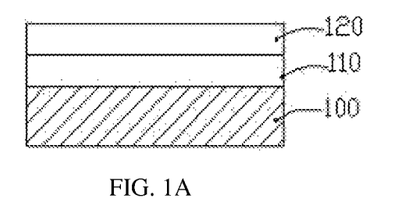
FIG. 1A is a cross-sectional view of growing a gallium nitride-based semiconductor multilayer structure and plating a reflecting compound metal layer on a sapphire substrate according to the present invention.
Figure 1B:
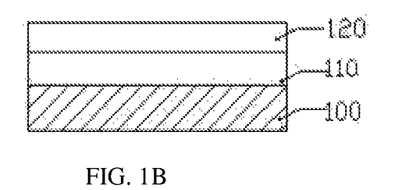
FIG. 1B is a cross sectional view after thinning and polishing the sapphire substrate.
Figure 1C:
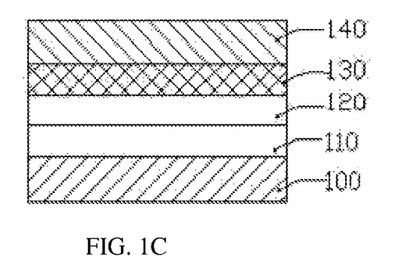
FIG. 1C is a cross-sectional after bonding the first glare with a first temporary substrate.
Figure 1D:
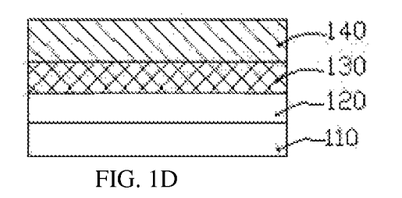
FIG. 1D is a cross sectional view after removing the sapphire substrate.
Figure 1E:
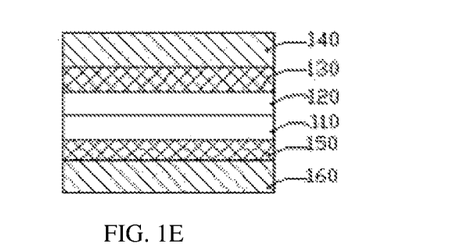
FIG. 1E is a cross-sectional after bonding the second glue with a second temporary substrate.
Figure 1F:
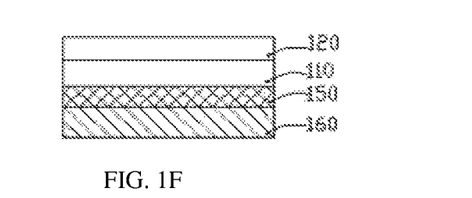
FIG. 1F is a cross-sectional view after removing the first temporary substrate the first glue.
Figure 1G:
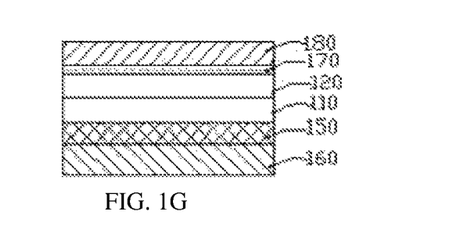
FIG. 1G is a cross-sectional view after coating the reflecting compound metal layer with a permanent substrate.
Figure 1H:
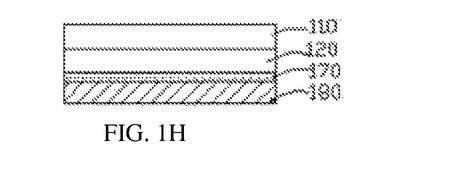
FIG. 1H is a cross-sectional view after removing the second temporary substrate and the second glue.

The method of the present invention comprises growing an n-type GaN layer, an active layer and a p-type GaN layer in turn on the sapphire substrate 100 to form a gallium nitride-based semiconductor multilayer structure 110 using MOCVD; coating a reflecting compound metal layer 120 on the gallium nitride-based semiconductor multilayer structure 110 by evaporating, as shown in FIG. 1A; thinning and polishing the sapphire substrate 100, as shown in FIG. 1B; coating a first glue 130 on the reflecting compound metal layer 120 and solidifying the first glue 130 with a first temporary substrate 140, as shown in FIG. 1C; peeling the sapphire substrate 100 off by laser, as shown in FIG. 1D; coating a second glue 150 on the GaN surface and solidifying the second glue 150 with a second temporary substrate 160, as shown in FIG. 1E; removing the first temporary substrate 140 and the first glue 130 when the second temporary substrate 160 and the second glue 150 are protected, as shown in FIG. 1F; bonding the reflecting compound metal layer 120 with a permanent substrate 180 using eutectic layer 170 after cleaning, as shown in FIG. 1G; removing the second temporary substrate 160 and the second glue 150, as shown in FIG. 1H; finally, completing the chips.

First Embodiment

An n-type GaN layer, an active layer and a p-type GaN layer are grown in turn on the sapphire substrate by MOCVD. Ag as a reflective metal layer is formed on the epitaxial layer by electron beam evaporation. And then Cr/Pt/Au multilayer metal film is evaporated on the reflective metal layer and then alloyed at the temperature of 500° C. The thickness of the sapphire substrate is 120 microns by thinning and polishing. And then the sapphire substrate is periodically cut to obtain single components. The thickness of the first glue is about 25 microns. It is a modified epoxy resin adhesive and coated on the reflecting compound metal layer and solidified with a first temporary silicon substrate at the temperature of 100° C. for 60 minutes. After curing its shore hardness is between 80 D and 10 D, resistance temperature is from −25° C. to 300° C., bending strength is within a range from 80 MPa to 120 MPa and compressive strength is between 200 MPa and 300 MPa. The sapphire substrate is lifted off by using the excimer laser at 248 nm and 500 mW. And then a second glue is coated on the peeling surface and solidified with a second temporary silicon substrate at the temperature of 150° C. for 30 minutes. The second glue is a modified heterocyclic resin. Its resistance temperature is between −55° C. and +420° C., tensile strength is between 60 MPa and 100 MPa and bending strength is between 105 MPa and 200 MPa. Next, when the second temporary silicon substrate and the second glue are protected by wax, the first temporary silicon substrate is etched by using hydrogen peroxide and hydrofluoric acid and nitric acid (5:2:2) and the high temperature mod Wed epoxy resin adhesive is etched by using toluene at the temperature of 100° C. The reflecting compound metal layer is bonded with a permanent silicon substrate by Au—Sn eutectic bonding at the temperature of 300° C. In addition, when the permanent silicon substrate is protected by wax, the second temporary silicon substrate is etched by using hydrogen peroxide and hydrofluoric acid and nitric acid (5:2:2) and the modified heterocyclic resin is etched by using sulfuric acid and hydrogen peroxide. Finally, n-type electrode is formed after cleaning the n-type GaN surface.

Second Embodiment

An n-type GaN layer, an active layer and a p-type GaN layer are grown on the sapphire substrate. Ag as a reflective metal layer and Cr/Pt/Au multilayer metal film are formed by electron beam evaporation and then alloyed at the temperature of 500° C. The thickness of the sapphire substrate is 150 microns by thinning and polishing. And then the sapphire substrate is periodically cut to obtain single components. A first glue about the thickness of 20 microns, a high temperature modified epoxy resin adhesive is coated on the reflecting compound metal layer and solidified with a first temporary silicon substrate at the temperature of 120° C. for 40 minutes. The sapphire substrate is lifted off by using the excimer laser at 193 nm and 480 mW. And then a second glue, the modified heterocyclic resin is coated on the newly exposed surface and solidified with a second temporary silicon substrate at the temperature of 120° C. for 60 minutes. Next when the second temporary silicon substrate and the second glue are protected by wax, the first temporary silicon substrate is etched by using hydrogen peroxide and hydrofluoric acid and nitric acid (5:2:2) and the high temperature modified epoxy resin adhesive is etched by using acetamide at the temperature of 120° C. After that, the reflecting compound metal layer is bonded with a permanent silicon substrate by Au-In eutectic bonding at the temperature of 230° C. In addition, when the permanent silicon substrate is protected by wax, the second temporary silicon substrate is etched by using hydrogen peroxide and hydrofluoric acid and nitric acid (5:2:2) and the modified heterocyclic resin is etched by using, sulfuric acid and hydrogen peroxide. Finally, n-type electrode is formed after cleaning the n-type GaN surface.

Third Embodiment

A buffer layer, an n-type GaN layer, an active layer and a p-type GaN layer are grown on the sapphire substrate by MOCVD. Ag/Pt as a reflecting compound metal layer is formed by electron beam evaporation and then alloyed at the temperature of 500° C. The thickness of the sapphire substrate is 400 microns by polishing after the epitaxial wafer is coated by wax. And then the sapphire substrate is periodically cut to obtain single components. A first glue about the thickness of 60 microns, a high temperature modified epoxy resin adhesive is coated on the reflecting compound metal layer and solidified with a temporary sapphire substrate at the temperature of 120° C. for 60 minutes. And then the sapphire substrate is removed by using the excimer laser at 248 nm and 550 mW. And a second glue, a modified heterocyclic resin is coated on the peeling surface and solidified with a temporary silicon substrate at the temperature of 120° C. for 60 minutes. Next, when the second glue is protected by wax, the high temperature modified epoxy resin adhesive is etched by using acetamide at the temperature of 120° C. and the reflecting compound metal layer is bonded with a permanent silicon substrate by Au—Sn eutectic bonding at the temperature of 310° C. In addition, when the permanent silicon substrate is protected by wax, the temporary silicon substrate is etched by using Hydrogen peroxide and hydrofluoric acid and nitric acid (5: 2: 2) and the modified heterocyclic resin is etched by using Sulfuric acid and hydrogen peroxide. Finally, n-type electrode is fabricated after cleaning the n-type GaN surface.

Forth Embodiment

A buffer layer, an n-type GaN layer, an active layer and a p-type GaN layer are grown on the sapphire substrate. Ag as a reflective metal layer is formed by electron beam evaporation and then alloyed at the temperature of 500V. And then the thickness of the sapphire substrate is 400 microns by polishing after the epitaxial wafer is coated by wax. And then the sapphire substrate is periodically cut to obtain single components. A first glue about the thickness of 40 microns, a high temperature modified epoxy resin adhesive is coated on the reflecting compound metal. layer and solidified with a temporary silicon substrate at the temperature of 110° C. for 70 minutes. And then the sapphire substrate is removed by using the excimer laser it 193 nm and 500 mW. A second glue, a modified heterocyclic resin is coated on the peeling surface and solidified with a temporary sapphire substrate at the temperature of 150° C. for 30 minutes. After that, the first temporary silicon substrate is etched by using Hydrogen peroxide and hydrofluoric acid and nitric acid (5:2:2) and then the high temperature modified epoxy resin adhesive is etched by using toluene at the temperature of 100° C. The reflecting compound metal layer is bonded with a permanent silicon substrate by Au—Sn eutectic bonding at the temperature of 310° C. Next, the modified heterocyclic resin is etched by using acetamide at the temperature of 120° C. n-type electrode is formed after cleaning the n-type GaN surface.

FIGS. 3A through 11K are cross-sectional views illustrating the process for manufacturing gallium nitride-based film chip according to an embodiment of the present invention.

Figure 2A:
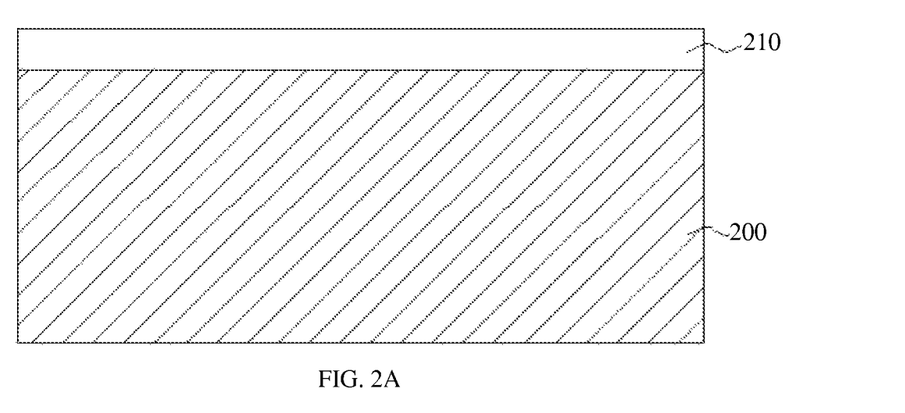
FIG. 2A is a cross-sectional view of growing an epitaxial layer on the sapphire substrate.
Figure 2B:
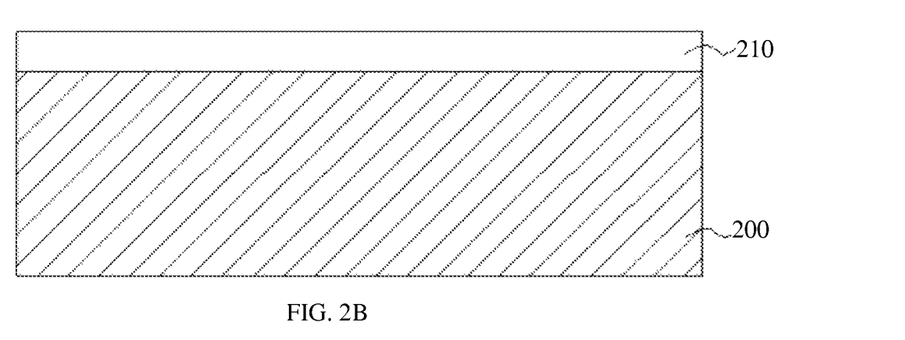
FIG. 2B is a cross-sectional view after thinning the sapphire substrate.
Figure 2C:
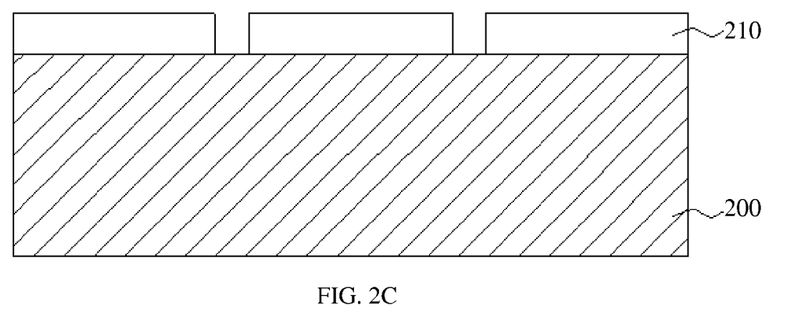
FIG. 2C is a cross-sectional view after etching of the epitaxial layer.
Figure 2D:
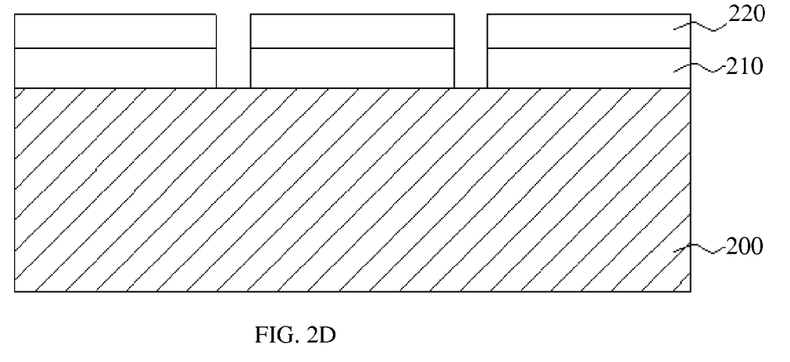
FIG. 2D is a cross-sectional view after coating a protective layer on the epitaxial layer.
Figure 2E:
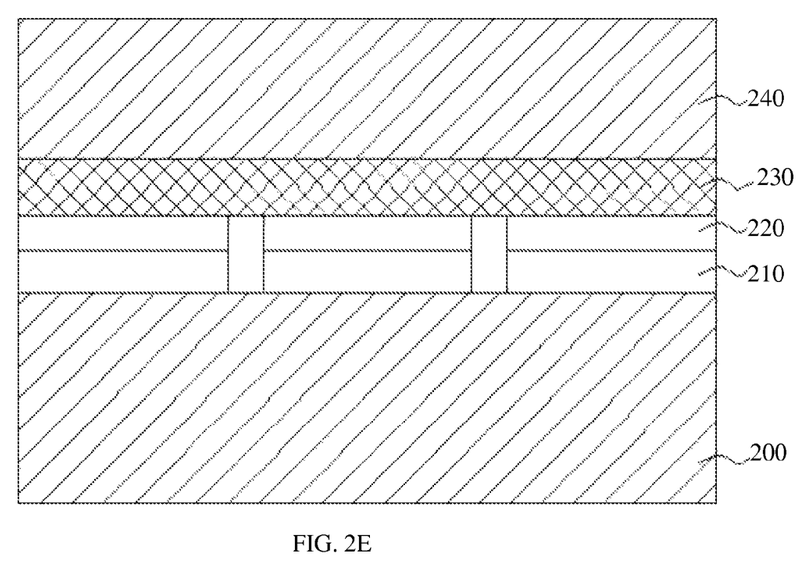
FIG. 2E is a cross-sectional view after bonding the first glue with a first temporary substrate on the protective layer.
Figure 2F:
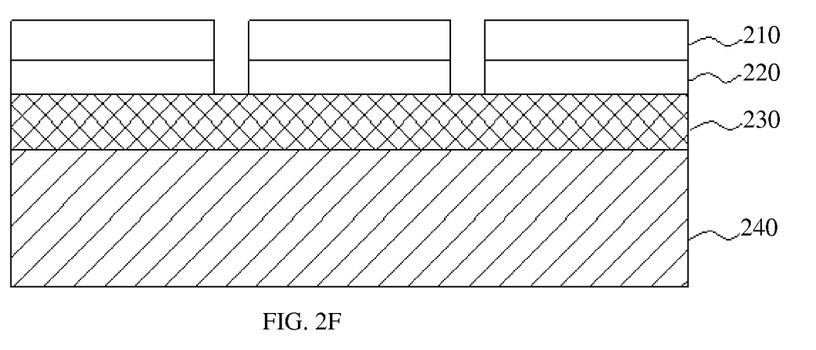
FIG. 2F is a cross-sectional view after removing the sapphire substrate by laser.
Figure 2G:
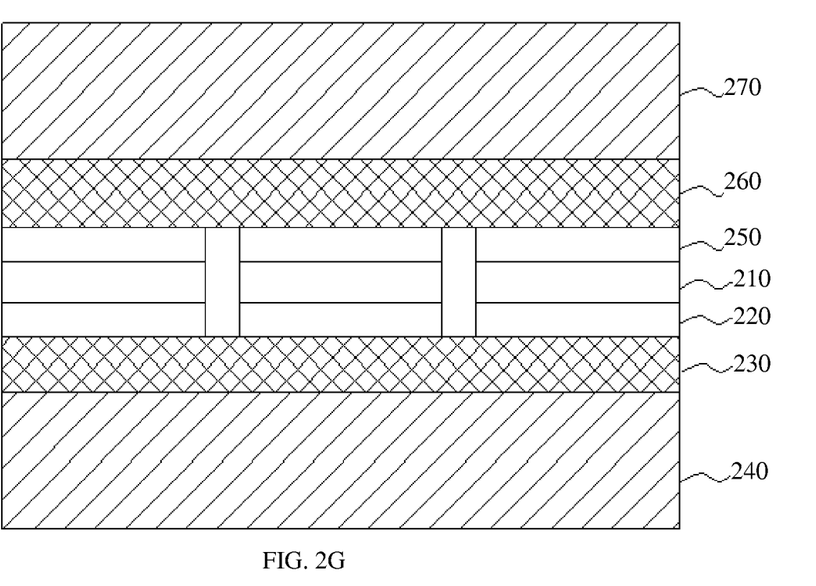
FIG. 2G is a cross-sectional view after bonding the second glue with a second temporary substrate.
Figure 2H:
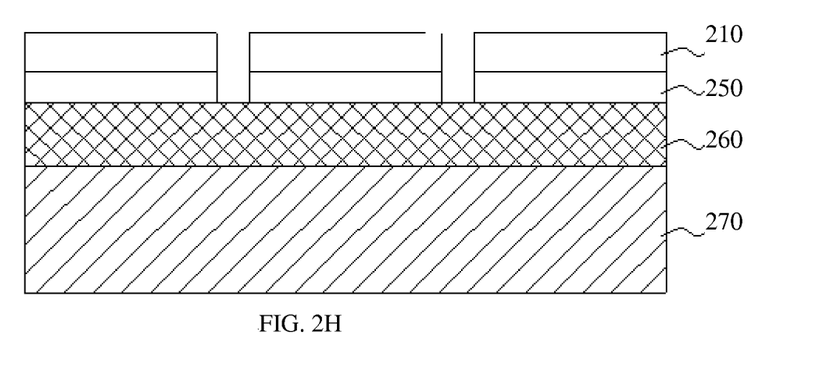
FIG. 2H is a cross-sectional view after removing the first temporary substrate and the first glue.
Figure 2I:
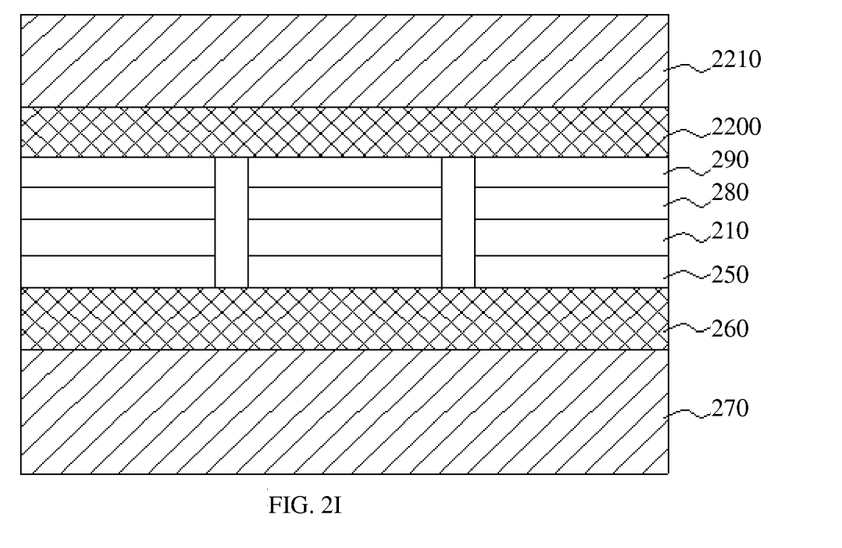
FIG. 2I is a cross-sectional view after bonding the reflecting compound metal layer with a permanent substrate.
Figure 2J:
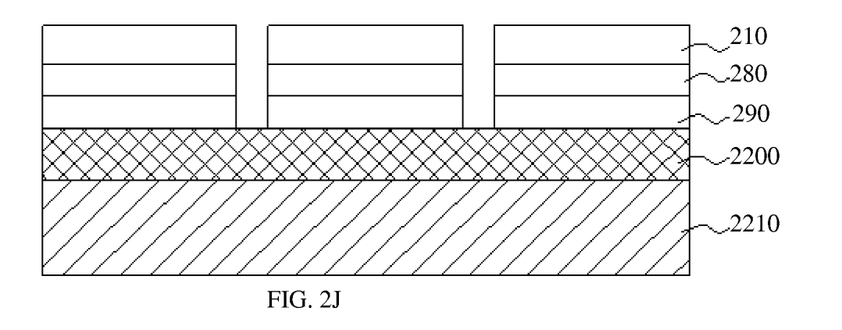
FIG. 2J is a cross-sectional view after removing the second temporary substrate and the second glue.
Figure 2K:
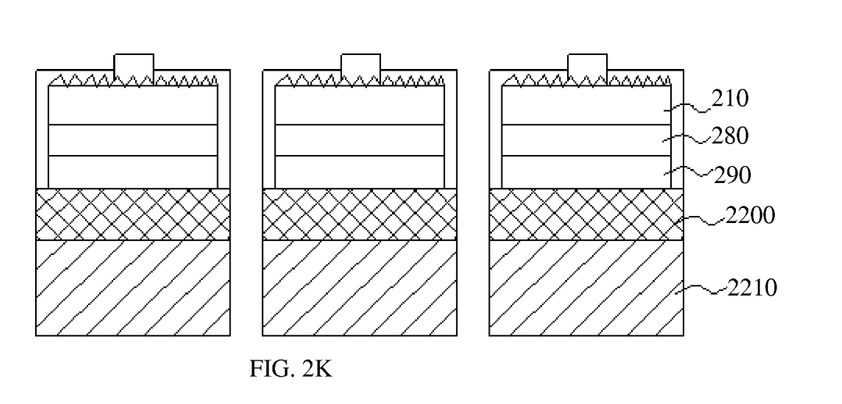
FIG. 2K is a cross-sectional view of the chip.

An n-type GaN layer, an active layer and a p-type GaN layer are grown in turn on the sapphire substrate 200 to for an epitaxial layer 210 by MOCVD. as shown in FIG. 2A. The thickness of the sapphire substrate 200 is 380 microns by thinning and polishing, as shown in FIG. 2B. The epitaxial layer 210 may he etched by the ICP etching or other means. The epitaxial layer 210 may be etched into or not, for example the etching depth of 5.5 microns, as shown in FIG. 2C. And the p-type GaN layer is coated by a protective layer 220, which is made up of the Ti layer and the Al layer. The thickness of Ti layer and Al layer is designed in 300 nm respectively. it should he noted that the protective layer 220 is not required, as shown in FIG. 2D. A first glue 230 is coated on the protective layer 220 and solidified with a first temporary substrate (such as silicon, ceramic, W, Cu, Mo, GaAs, graphite) 240 at the temperature of 80° C. for 30 minutes. The first glue 230 is a modified epoxy resin adhesive. Its resistance temperature is more than 150° C., as shown in FIG. 2E. The sapphire substrate is removed by laser and the n-type GaN layer 210 is revealed, as shown in FIG. 2F. The n-type GaN layer is coated by a protective layer 250, which is composed of Ti layer and the Au layer. The thickness of Ti layer and Au layer is designed in 500 nm respectively. The protective layer 250 is bonded with a temporary silicon substrate 270 by Au—In 260 eutectic bonding at the temperature of 250° C., as shown in FIG. 2G. Next, when the second temporary silicon substrate 270 is protected by wax, the first temporary silicon substrate 240, the first glue 230 and the protective layer 220 are etched in turns by using nitric acid, hydrofluoric acid and sulfuric acid. And then the p-type GaN layer 210 is revealed, as shown in FIG. 2H. And the thickness of 1000 angstroms Ag layer as a reflective metal layer 280 is evaporated on the p-type GaN layer 210 and then alloyed at the temperature of 420° C. for 10 minutes. It should be noted that the reflective metal layer 280 can be also grown after the epitaxial layer 210 is formed at first. The thickness of 1000 angstroms Pt layer 290 is formed by electron beam evaporation and then the Pt layer is bonded with a permanent silicon substrate 2210 by Au—Sn 2200 eutectic bonding at the temperature of 350° C., as shown in FIG. 2I. After that, when the permanent silicon substrate 2210 is protected. the second temporary silicon substrate 270 and AuIn layer 260 are etched by using nitric acid, hydrofluoric acid and ammonium iodide in turns, as shown in FIG. 2J. Next, n-type GaN layer 210 is roughened, in the potassium hydroxide solution and then the Al electrode is formed by electron beam evaporation. Finally, chips are obtained, as shown in FIG. 2K.

FIGS. 3A through 3H are cross-sectional views illustrating a method of manufacturing gallium nitride-based film chip according to other embodiment of the present invention.

Figure 3A:
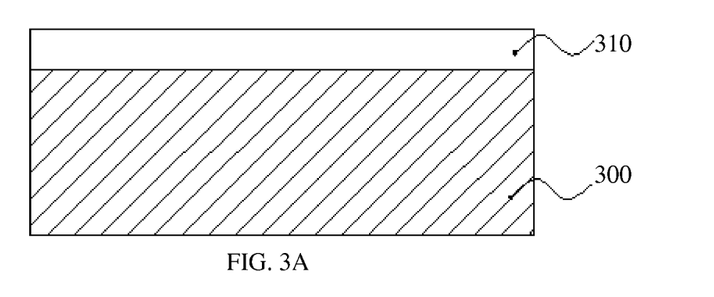
FIGS. 3A through 3H are graphs showing the technological process of fabricating a gallium nitride-based chip according to the present invention.
Figure 3B:
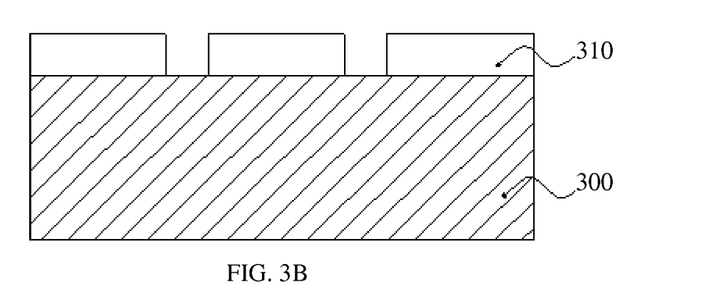
Figure 3C:
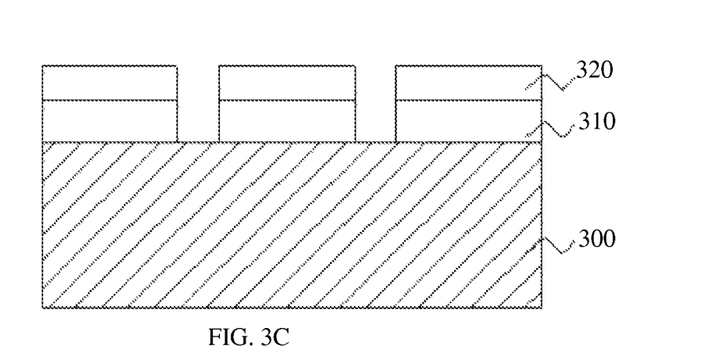
Figure 3D:
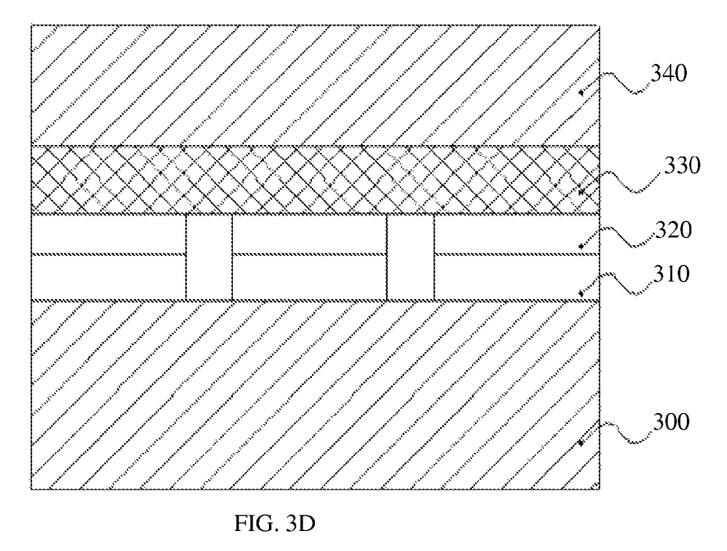
Figure 3E:
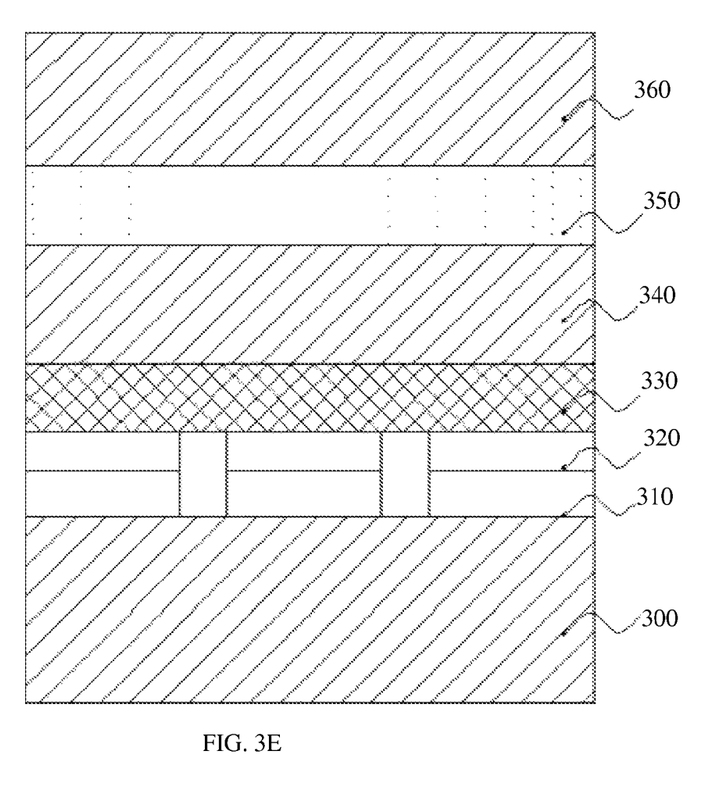

An n-type GaN layer, an active layer and a p-type GaN layer are grown in turn on the sapphire substrate 300 to form an epitaxial layer 310 by MOCVD, as shown in FIG. 3A. The epitaxial layer 310 may be etched to form an epitaxial layer separation 310, for example the etching depth of 5.5 microns, as shown in FIG. 3B. The Ni layer and the Ag layer as a reflecting compound metal layer 320 is formed by electron beam evaporation and then alloyed at the temperature of 420° C. for 10 minutes. The thickness of Ni layer and Ag layer is designed in 2 nm and 100 nm respectively. The Pt layer and the Au layer are grown on the reflecting compound metal layer 320 by electron beam evaporation. The thickness of Pt layer and Au layer is designed in 500 nm respectively, as shown in FIG. 3C. The reflecting compound metal layer 320 is bonded with a permanent silicon substrate 340 by Au—Sn eutectic bonding 330 at the temperature of 360° C., as shown in FIG. 3D. A first glue 350 is coated on the surface of the permanent silicon substrate 340 and solidified with a temporary silicon substrate 360, as shown in FIG. 3E. Then the sapphire substrate 300 is peeled off by laser, as shown in FIG.

Figure 3F:
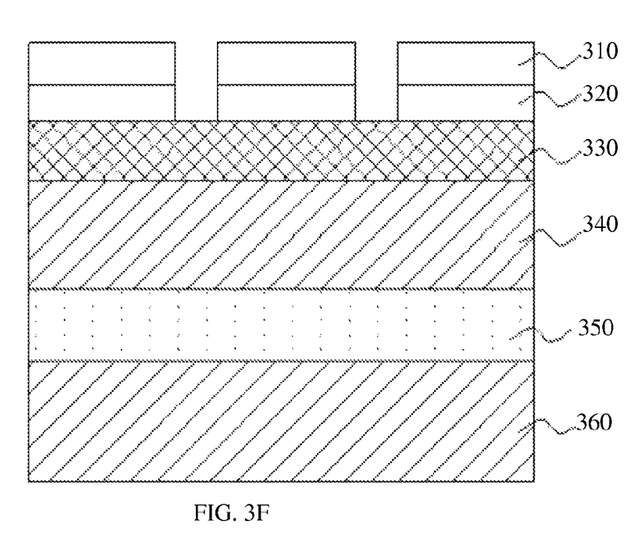
Figure 3G:
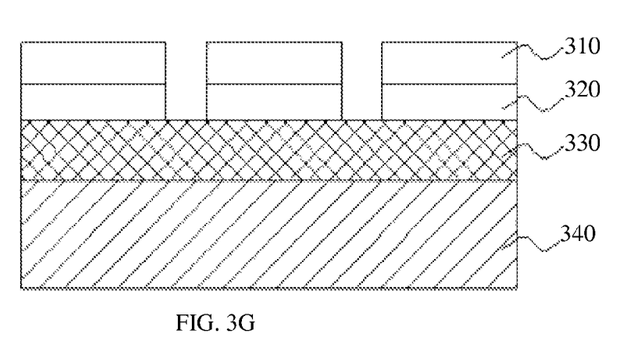
Figure 3H:
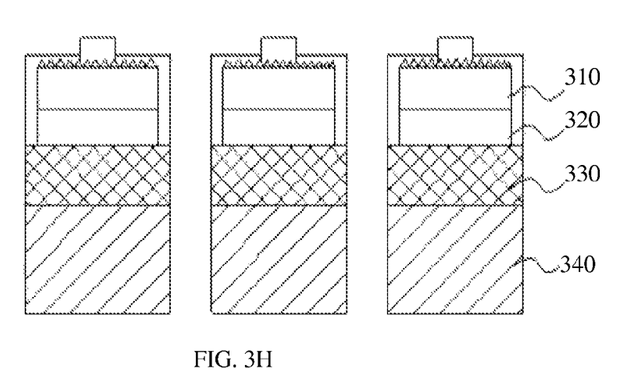

3F. Next, the temporary silicon substrate 360 and the first glue 350 are etched by using nitric acid, sulfuric acid, hydrofluoric acid and Hydrogen peroxide, as shown in FIG. 3G. After that, n-type GaN layer 310 is roughened and then the Al electrode is formed by electron beam evaporation. Finally, chips are obtained, as shown in FIG. 3H.

While the invention has been described in terms of several exemplary embodiments, those skilled on the art will recognize that the invention can be practiced with modification within the spirit and scope of the appended claims. In addition, it is noted that, the Applicant's intent is to encompass equivalents of all claim elements, even if amended later during prosecution.

What is claimed is:

1. A method for manufacturing gallium nitride-based film chip, the method comprising:
   a. growing an n-type GaN layer, an active layer and a p-type GaN layer in turn on a sapphire substrate to form semiconductor multilayer structure;
   b. thinning and polishing the sapphire substrate;
   c. coating a first glue on the semiconductor multilayer structure and solidifying the first glue with a first temporary substrate, wherein thickness of the first glue is between 10 microns and 100 microns, curing temperature is between 80° C. and 160° C., curing time is between 30 minutes and 120 minutes;
   d. removing the sapphire substrate via laser, coating a second glue on a peeling surface and solidifying the second glue with a second temporary substrate, wherein thickness of the second glue is between 5 microns and 30 microns, curing temperature is between 120° C. and 180° C., curing time is between 10 minutes and 60 minutes;
   e. removing the first temporary substrate and the first glue;
   f. bonding the semiconductor multilayer structure with a permanent substrate by eutectic bonding;
   g. removing the second temporary substrate and the second glue.

2. The method of claim 1, wherein a conductive reflecting compound metal layer is coated on the semiconductor multilayer structure by evaporating, then the semiconductor multilayer structure is alloyed, and the alloying temperature is between 400° C. and 600° C. .

3. The method of claim 1, wherein the eutectic bonding is Au-Sn bonding, the bonding temperature is between 200° C. and 400° C. .

* * * * *